(12) United States Patent
Wilson et al.

(10) Patent No.: US 11,686,539 B2
(45) Date of Patent: Jun. 27, 2023

(54) COLDPLATE WITH HEAT TRANSFER MODULE

(71) Applicant: Raytheon Company, Waltham, MA (US)

(72) Inventors: James S. Wilson, Waltham, MA (US); James Giesey, Waltham, MA (US)

(73) Assignee: RAYTHEON COMPANY, Waltham, MA (US)

(*) Notice: Subject to any disclaimer, the term of this patent is extended or adjusted under 35 U.S.C. 154(b) by 473 days.

(21) Appl. No.: 16/813,202

(22) Filed: Mar. 9, 2020

(65) Prior Publication Data

US 2021/0278146 A1    Sep. 9, 2021

(51) Int. Cl.
| | | |
|---|---|---|
| *F28F 9/02* | (2006.01) | |
| *F28F 1/02* | (2006.01) | |
| *F28F 1/40* | (2006.01) | |
| *F28F 3/02* | (2006.01) | |
| *F28F 3/12* | (2006.01) | |
| *H05K 7/20* | (2006.01) | |

(52) U.S. Cl.
CPC ............ *F28F 9/026* (2013.01); *F28F 1/022* (2013.01); *F28F 1/40* (2013.01); *F28F 3/025* (2013.01); *F28F 3/12* (2013.01); *H05K 7/20254* (2013.01); *F28F 2275/025* (2013.01); *F28F 2275/04* (2013.01); *F28F 2275/06* (2013.01)

(58) Field of Classification Search
CPC .... F28F 9/026; F28F 1/022; F28F 1/40; F28F 3/025; F28F 3/12; F28F 2275/025; F28F 2275/04; F28F 2275/06; H05K 7/20254

USPC .................................................. 165/159, 170
See application file for complete search history.

(56) References Cited

U.S. PATENT DOCUMENTS

| | | | |
|---|---|---|---|
| 3,552,488 A * | 1/1971 | Grill ...................... | F28D 9/0025 165/DIG. 399 |
| 4,971,144 A | 11/1990 | Gibson et al. | |
| 5,040,596 A * | 8/1991 | Terasaki ............... | F28D 9/0062 165/185 |
| 5,689,898 A * | 11/1997 | Renzi ....................... | F26B 5/06 34/239 |
| 5,812,372 A | 9/1998 | Galyon et al. | |
| 6,819,561 B2 | 11/2004 | Hartzell et al. | |
| 7,017,651 B1 | 3/2006 | Wilson et al. | |
| 7,178,586 B2 | 2/2007 | Goldman et al. | |

(Continued)

FOREIGN PATENT DOCUMENTS

| | | |
|---|---|---|
| DE | 202007001266 U1 | 6/2007 |
| EP | 1175135 A1 | 1/2002 |
| WO | 2005/080902 A1 | 9/2005 |

OTHER PUBLICATIONS

International Search Report and Written Opinion from related PCT Application No. PCT/US2020/062902 dated Mar. 24, 2021.

*Primary Examiner* — Justin M Jonaitis
(74) *Attorney, Agent, or Firm* — Burns & Levinson, LLP; Joseph M. Maraia

(57) ABSTRACT

A coldplate assembly includes a plurality of leak-tight conduit modules provided between a base and a cover to couple a first manifold cavity to a second manifold cavity. Each leak-tight conduit module includes a heat conducting structure and is pre-constructed and pre-tested prior to integration into the coldplate assembly. Each leak-tight conduit module is sealed only near the ends of the module that are disposed in the respective manifold cavity.

20 Claims, 10 Drawing Sheets

(56) References Cited

U.S. PATENT DOCUMENTS

| | | | |
|---|---|---|---|
| 7,516,777 B2* | 4/2009 | Terakado | F28F 3/12 |
| | | | 165/170 |
| 9,291,403 B2* | 3/2016 | Hisanaga | F28F 1/40 |
| 9,936,607 B2 | 4/2018 | Chainer et al. | |
| 2003/0230399 A1* | 12/2003 | Hurlbert | F28D 1/0246 |
| | | | 257/E23.098 |
| 2006/0289147 A1* | 12/2006 | Zuo | F28D 9/0062 |
| | | | 165/104.33 |
| 2007/0240867 A1* | 10/2007 | Amano | H01L 23/473 |
| | | | 165/168 |
| 2010/0044019 A1* | 2/2010 | Maeda | F28F 13/02 |
| | | | 165/151 |
| 2011/0176274 A1 | 7/2011 | Sevaekivi | |

* cited by examiner

COLDPLATE WITH HEAT TRANSFER MODULE

GOVERNMENT FUNDING

N/A

BACKGROUND

Known liquid coldplates include internal coolant channels in which a heat transfer component such as, for example, finstock, is positioned. These components are often vacuum brazed into position. Current vacuum brazing process guidelines for coldplates include design rules in order to prevent leaks from the internal coolant channels. These rules include a requirement of providing sufficient space for a braze line thus reducing the amount of area available for coolant volume for heat transfer when the coldplate includes a large number of interconnects as the potential for leaks scales with the number of holes required for interconnects. Further, inspection of the brazing results is difficult for high density finstock, as traditional X-ray inspection methods do not provide the required resolution. The current method of reliable inspection requires an arduous computed tomography (CT) scan, which typically can cost $10,000 per part.

What is needed is an improved liquid coldplate assembly.

SUMMARY

According to one aspect of the present disclosure, there is a coldplate assembly, comprising: a base; a first conduit module of a first predetermined length having a first opening and a second opening; a first heat conducting structure provided within the first conduit module; a cover coupled to the base to capture the first conduit module between the base and the cover and to enclose and define a first manifold cavity between the base and the cover, wherein the first opening of the first conduit module is disposed in the first manifold cavity, and wherein the first opening of the first conduit module is sealed, about a portion of its periphery, a respective first sealing length, less than the first conduit module predetermined length, from the first opening toward the second opening.

Further, the first conduit module is one of: vacuum brazed about a portion of its periphery to the base and cover; sealed about a portion of its periphery to the base and cover by an adhesive; or welded about a portion of its periphery to the base and cover.

According to another aspect of the present disclosure, there is a coldplate assembly, comprising: a base; a cover; and a first conduit module of a first predetermined length comprising: a first opening; a second opening; and a heat conducting structure provided within the first conduit module. The cover coupled to the base to capture the first conduit module between the base and cover and to form first and second enclosed manifold cavities between the base and the cover, wherein the first opening of the first conduit module is disposed within the first manifold cavity and the second opening of the first conduit module is disposed within the second manifold cavity, wherein the first opening of the first conduit module is sealed, about a portion of its respective periphery within the first manifold cavity, a respective first sealing length, less than the first conduit module predetermined length, from the respective first opening toward the respective second opening, wherein the respective second opening of the first conduit module is sealed, about a portion of its respective periphery within the second manifold cavity, a respective second sealing length, less than the first conduit module predetermined length, from the respective second opening toward the respective first opening, and wherein the first and second manifold cavities are fluidly coupled to one another by the first conduit module.

BRIEF DESCRIPTION OF THE DRAWINGS

Various aspects of the disclosure are discussed below with reference to the accompanying Figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The Figures are provided for the purposes of illustration and explanation and are not intended as a definition of the limits of the disclosure. In the Figures.

DETAILED DESCRIPTION

Figure 1:
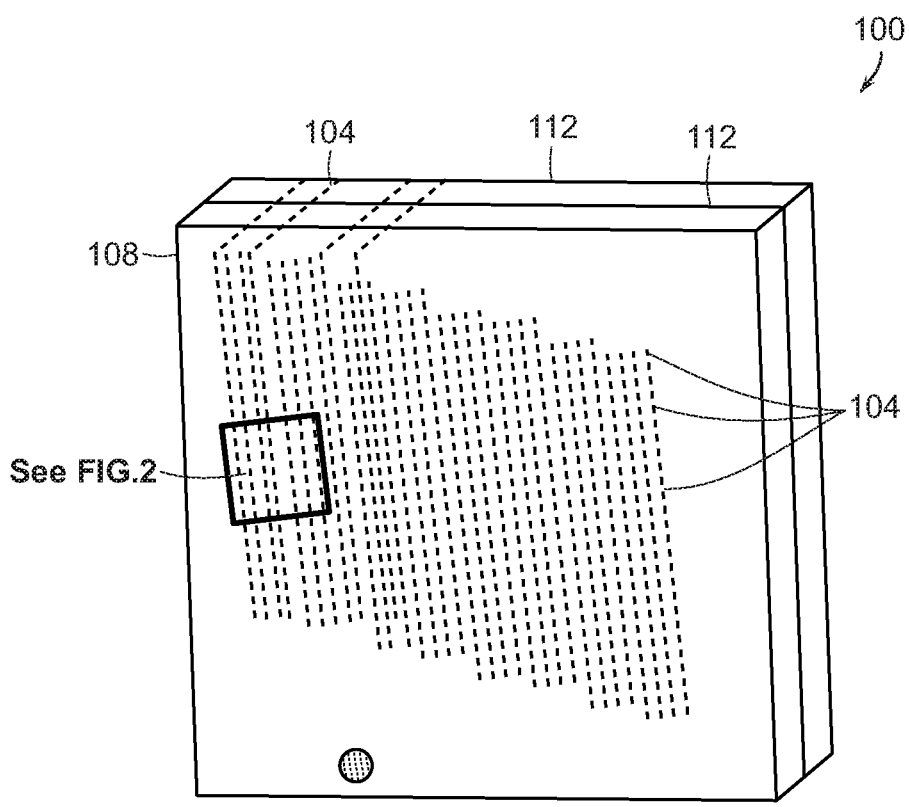
FIG. 1 is a coldplate assembly.

In the following description, details are set forth in order to provide a thorough understanding of the aspects of the disclosure. It will be understood by those of ordinary skill in the art that these may be practiced without some of these specific details. In other instances, well-known methods, procedures, components and structures may not have been described in detail so as not to obscure the aspects of the disclosure.

It is to be understood that the disclosure is not limited in its application to the details of construction and the arrangement of the components set forth in the following description or illustrated in the drawings as it is capable of implementations or of being practiced or carried out in various ways. Also, it is to be understood that the phraseology and terminology employed herein are for the purpose of description only and should not be regarded as limiting.

Certain features, which are, for clarity, described in the context of separate implementations, may also be provided in combination in a single implementation. Conversely, various features, which are, for brevity, described in the context of a single implementation, may also be provided separately or in any suitable sub-combination.

It should be noted that, where used, "top," "bottom," "upper," "lower," etc., are merely for explaining the relative placement of components described herein. These relative placement descriptions are not meant to limit the claims with respect to a direction of gravity or a horizon.

Generally, and as will be described in more detail below, aspects of the present disclosure provide an extruded or sealed tube to replace the finstock section inside a coldplate that uses vacuum brazing. The tube is already constructed and pre-tested so it is known to be leak-tight prior to integration into the coldplate. Advantageously, the sealing, i.e., vacuum brazing, of the tube only needs to be achieved at the ends of the tube and, therefore, an internal offset for the braze surface is not needed along the length of the tube, advantageously providing additional area for cooling and interconnects.

Figure 2:
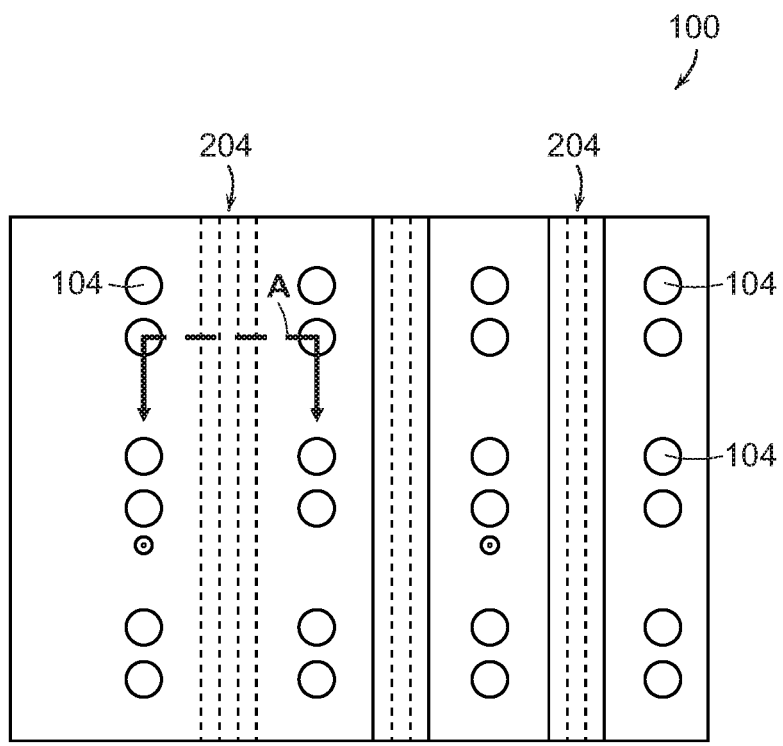
FIG. 2 is close-up of a portion of the coldplate assembly of FIG. 1.

Referring now to FIG. 1, and to FIG. 2, a close-up of a portion of FIG. 1, a coldplate assembly 100 includes a number of interconnects, or through-holes 104, that run through a first substrate or top plate 108 to a second substrate or bottom plate 112, as is generally understood. Flow channels 204 run between the interconnects 104 to carry fluid from a first manifold to a second manifold (not shown in FIGS. 1 and 2) in order to, for example, remove heat.

A close-up of a portion of the coldplate assembly 100 is presented in FIG. 2. As shown, the interconnects, or through-holes 104, are generally linearly arranged and have a channel 204 running between adjacent rows of interconnects 104.

Figure 3:
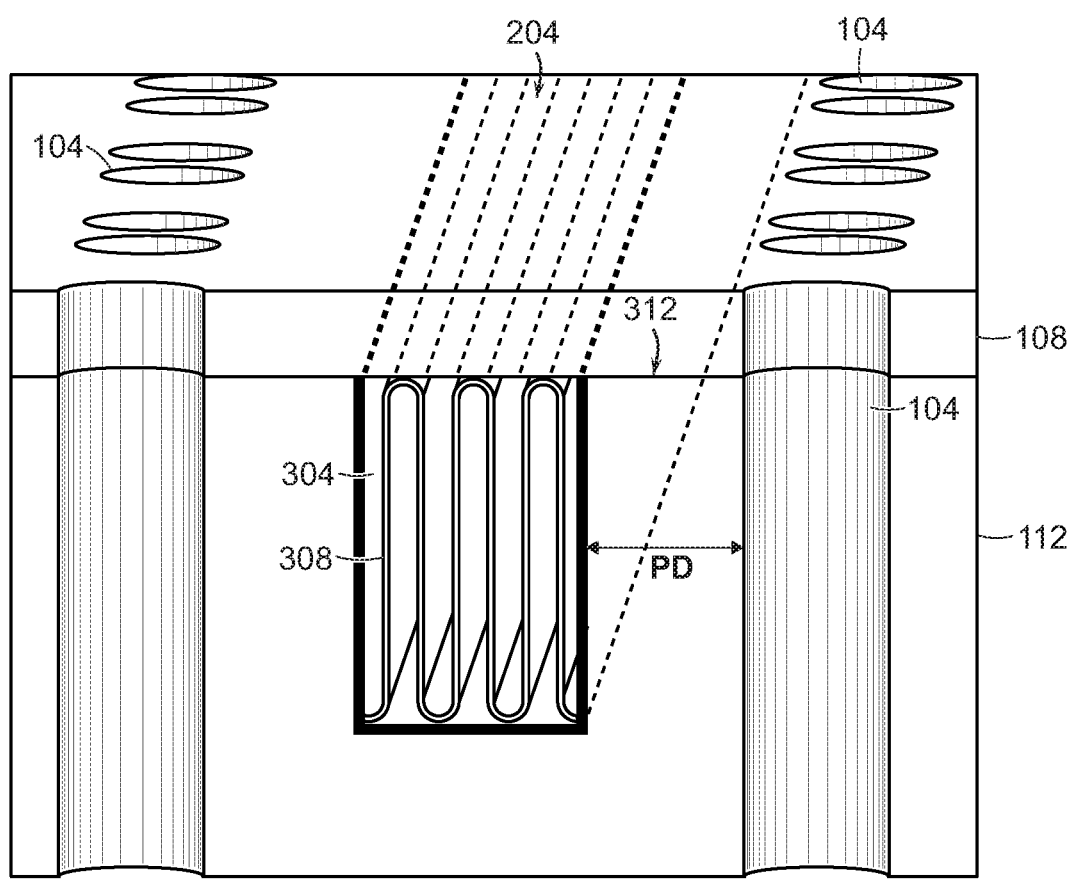
FIG. 3 presents a cut-away view from a direction A, as shown in FIG. 2, of the coldplate assembly of FIG. 1.

FIG. 3 presents a cut-away view from a direction A, as shown in FIG. 2, of the coldplate assembly 100. Each channel 204 comprises a linear groove 304 in the bottom plate 112 where the groove 304 is linearly positioned between the linearly arrayed interconnects 104. A piece of finstock 308 is provided in the groove 304 and captured by the placement of the top plate 108.

The top and bottom plates 108, 112 are connected to each other by vacuum brazing along a faying surface (not shown). Leakage of any fluid in the channel 204, via an interface 312 between the top and bottom plates 108, 112, must be avoided. Accordingly, a predetermined amount of distance PD is mandated between the groove 304 and any adjacent interconnects 104. This mandated distance PD, however, uses up valuable real estate in the coldplate structure.

Figure 4:
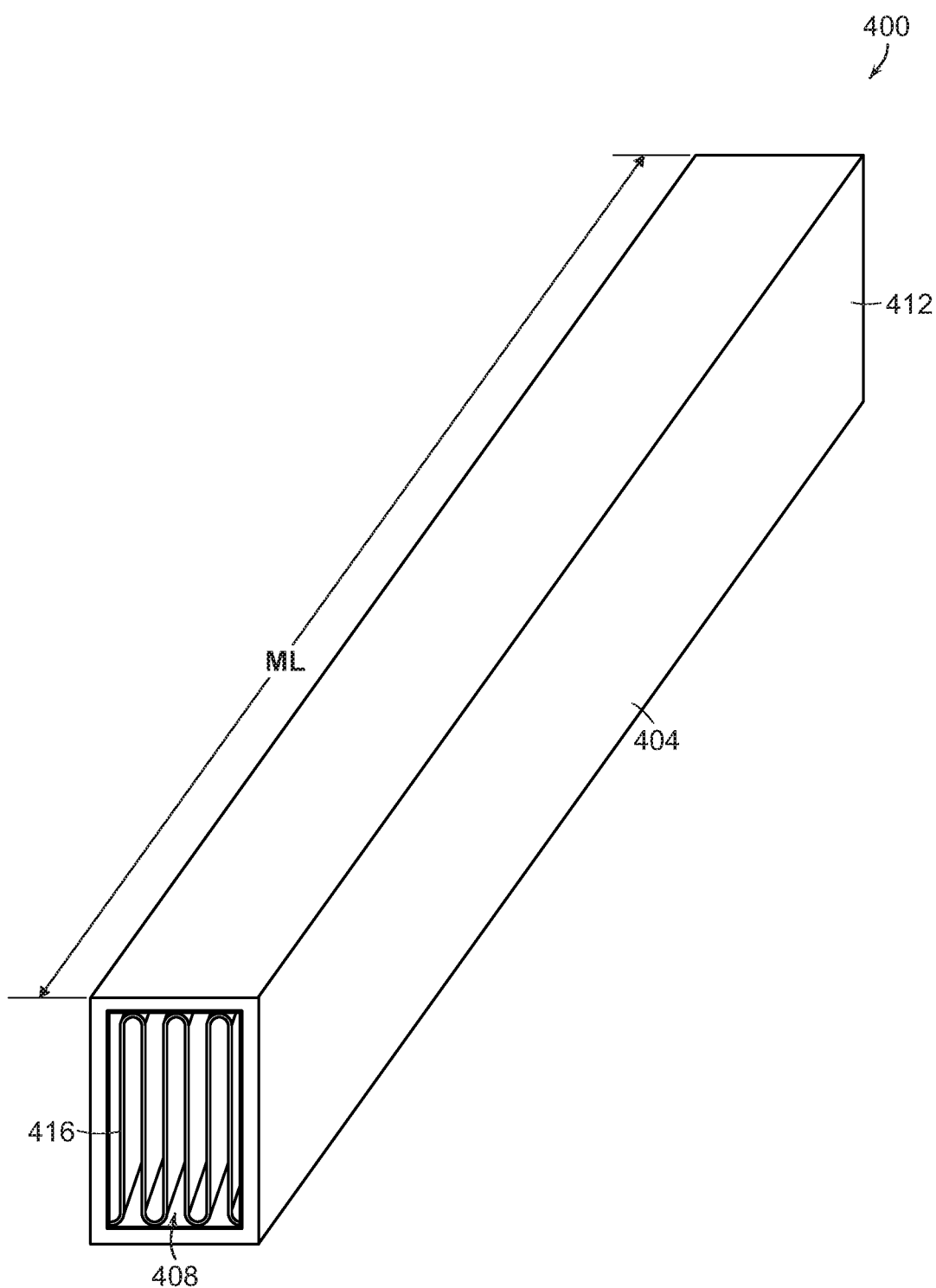
FIG. 4 is a conduit module in accordance with an aspect of the present disclosure.
Figure 5:
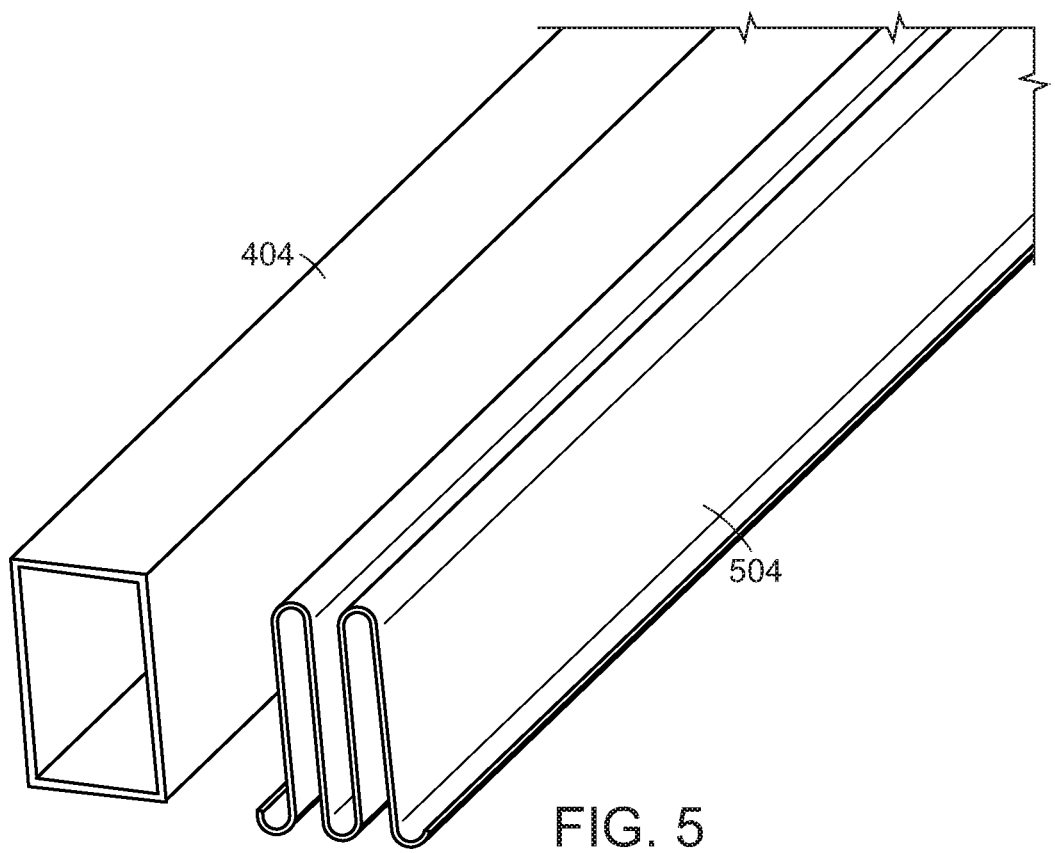
FIG. 5 is an exploded view of the conduit module of FIG. 4.
Figure 6:
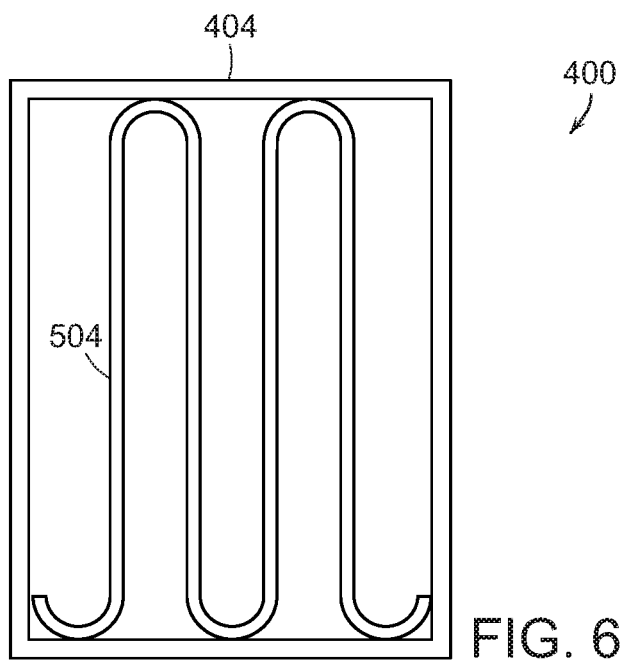
FIG. 6 is an end-view of the conduit module of FIG. 4.

Referring now to FIG. 4, in accordance with an aspect of the present disclosure, there is provided a conduit module 400 having a leak-tight tube 404 of a predetermined length ML having a first opening 408 and a second opening 412. The tube 404 can have a rectangular cross-section and have walls of a thickness necessary to meet the parameters of a coldplate assembly as is known. A heat conducting structure 416 is provided within the conduit module 400 such as, for example but not limited to, finstock 504, as shown in FIGS. 5 and 6, the latter being an end-view of the module 400.

The finstock 504 is placed inside of the tube 404 of the conduit module 400 and, for example, ultrasonically welded to attach the finstock 504 to the tube 404. Advantageously, the conduit module 400 allows for pre-inspection, which greatly reduces post assembly coldplate inspection costs and difficulties, provides increased volume for coolant flow and provides for a modular construction, as discussed below.

Figure 7A:
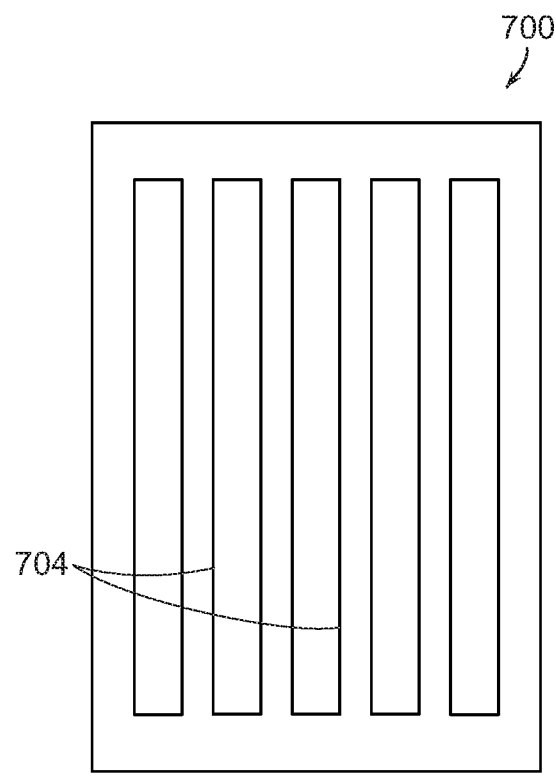
FIGS. 7A and 7B present views of a conduit module in accordance with another aspect of the present disclosure.
Figure 7B:
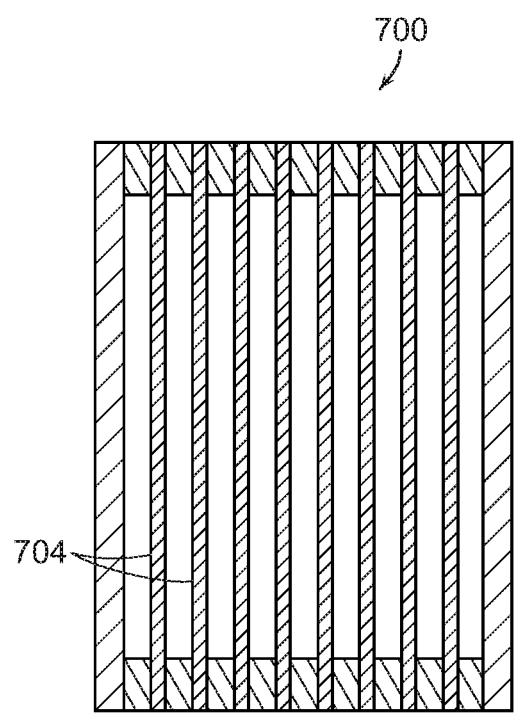

In another aspect of the present disclosure, a conduit module 700, as shown in cross-section in FIGS. 7A and 7B, is built with diffusion bonded sections 704 that can be inspected and tested prior to integration.

Figure 8:
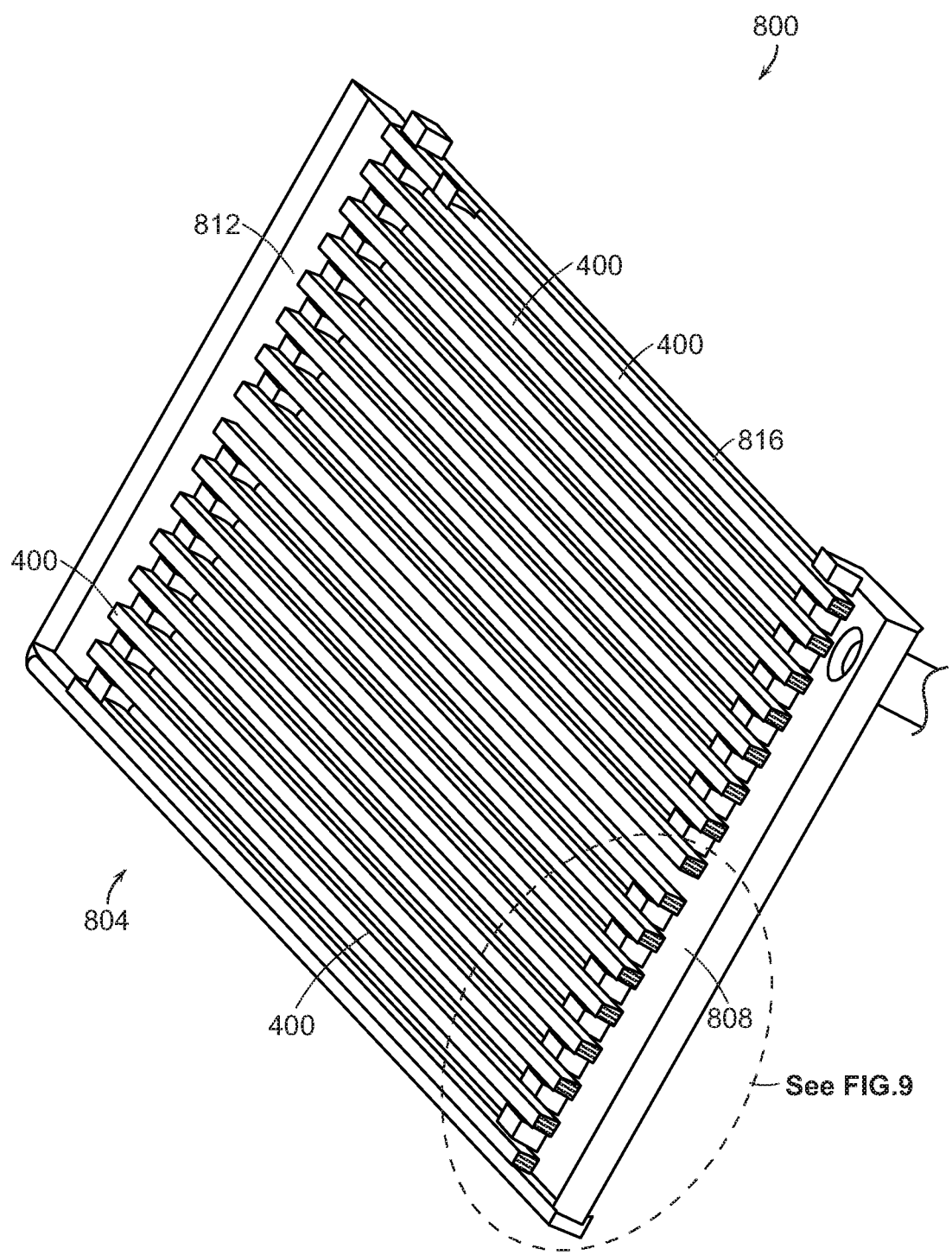
FIG. 8 is a coldplate assembly in accordance with an aspect of the present disclosure.
Figure 9:
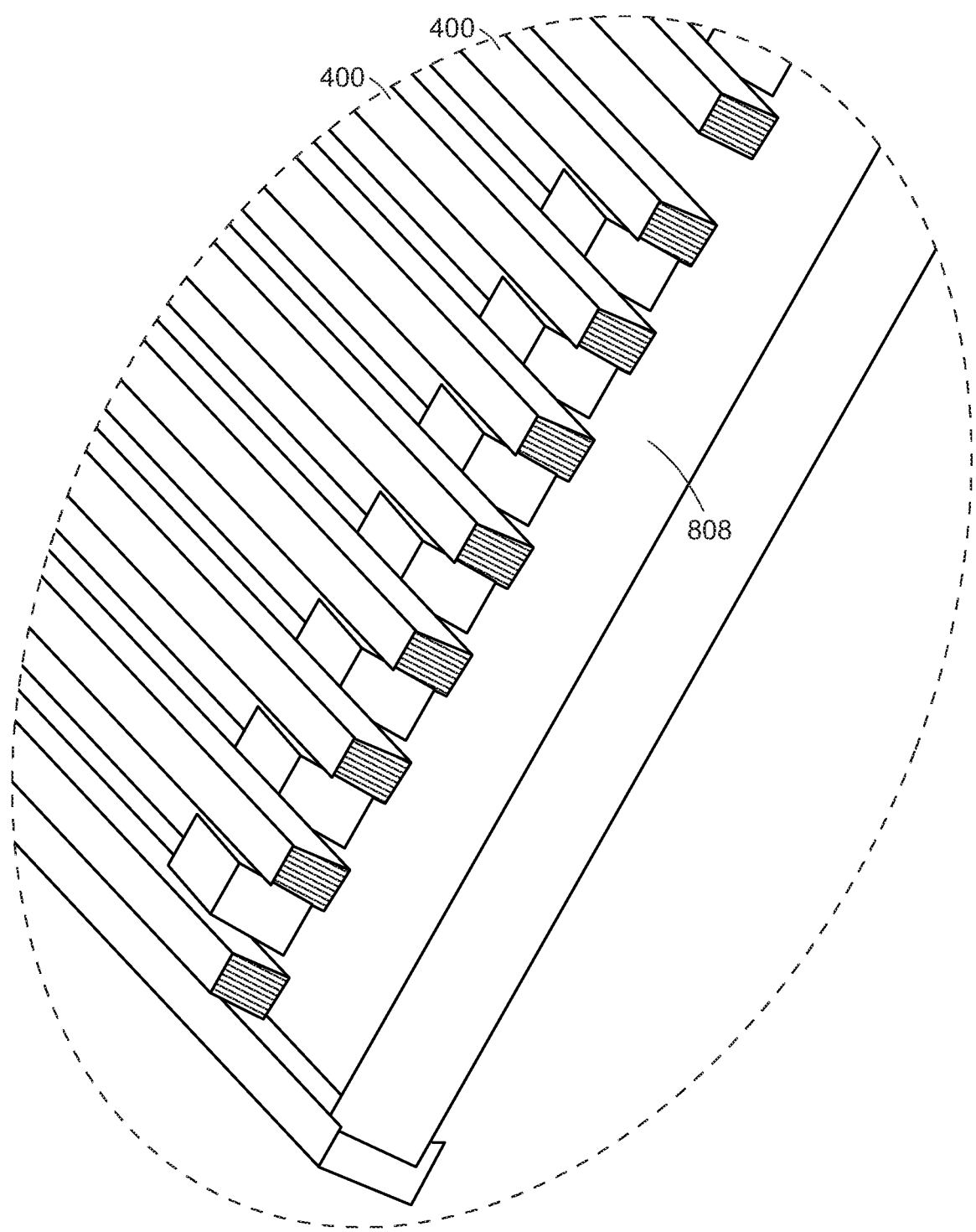
FIG. 9 is a close-up view of a portion of the coldplate assembly of FIG. 8.

Referring now to FIG. 8, a coldplate assembly 800 in accordance with an aspect of the present disclosure includes a first substrate or base 804 having a first manifold cavity 808 and a second manifold cavity 812 defined therein. A plurality of grooves 816 are provided in the base 804 and generally run from the first manifold cavity 808 to the second manifold cavity 812. A plurality of conduit modules 400 are provided in respective grooves 816 such that the respective first opening and second opening 408, 412 of each module 400 is in fluid connection with the first manifold cavity 808 and the second manifold cavity 812, as is shown in close-up in FIG. 9.

Figure 10:
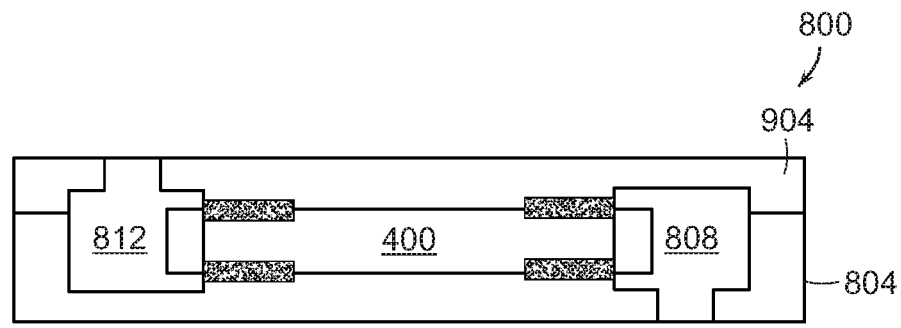
FIG. 10 is a cross-sectional view of the coldplate assembly of FIG. 8.

The conduit modules 400 are captured between the base 804 and a second substrate or top 904 as shown in side-view in FIG. 10. Accordingly, the first manifold cavity 808 and the second manifold cavity 812 are in fluid connection with one another.

Advantageously, as each of the conduit modules 400 has been confirmed to be leak-tight prior to placement, it only remains for the ends of each of the conduit modules 400 to be sealed, i.e., the ends of the conduit modules 400 that are provided in the manifold cavities 808, 812.

Figure 11:
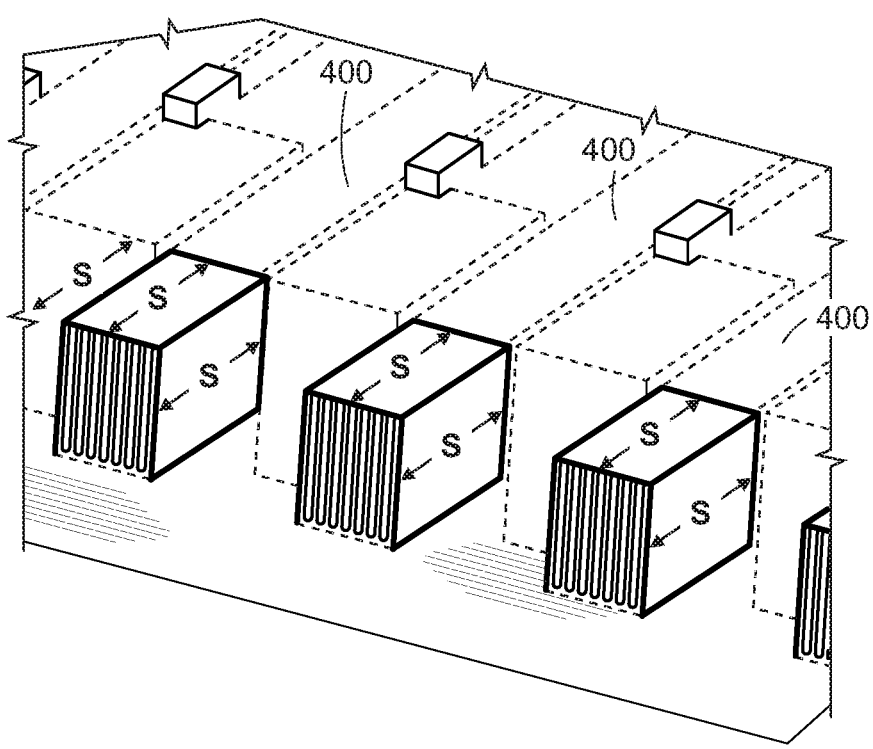
FIG. 11 is a close-up view of a portion of the coldplate assembly of FIG. 8.
Figure 12:
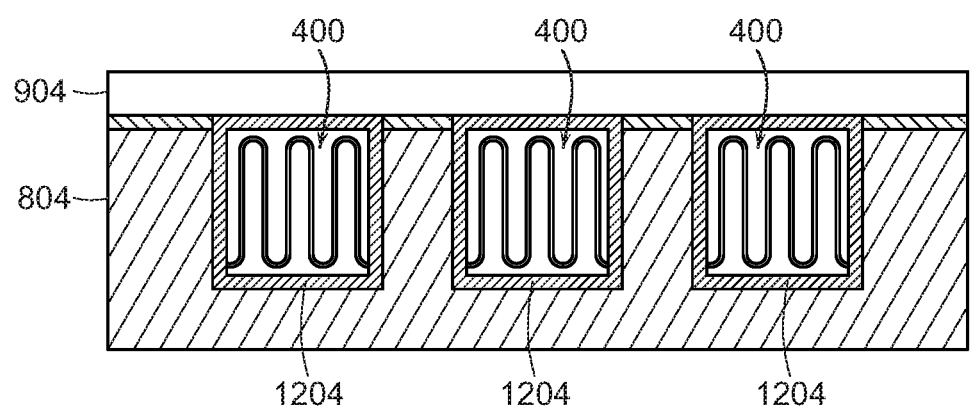
FIG. 12 is an end-view of a portion of the coldplate assembly of FIG. 8.

Referring now to FIG. 11, each of the openings of the conduit modules 400 is sealed, about its periphery, a respective first sealing length S from the first opening toward the second opening. As shown in FIG. 12, looking into each module 400, a seal 1204 assures that the two manifolds are fluidly coupled to one another only by the conduit modules and leakage is prevented. It should be noted that while the sealing distance S is shown as starting at the end of the module 400, the distance S can be offset some predetermined distance from the end.

Figure 13:
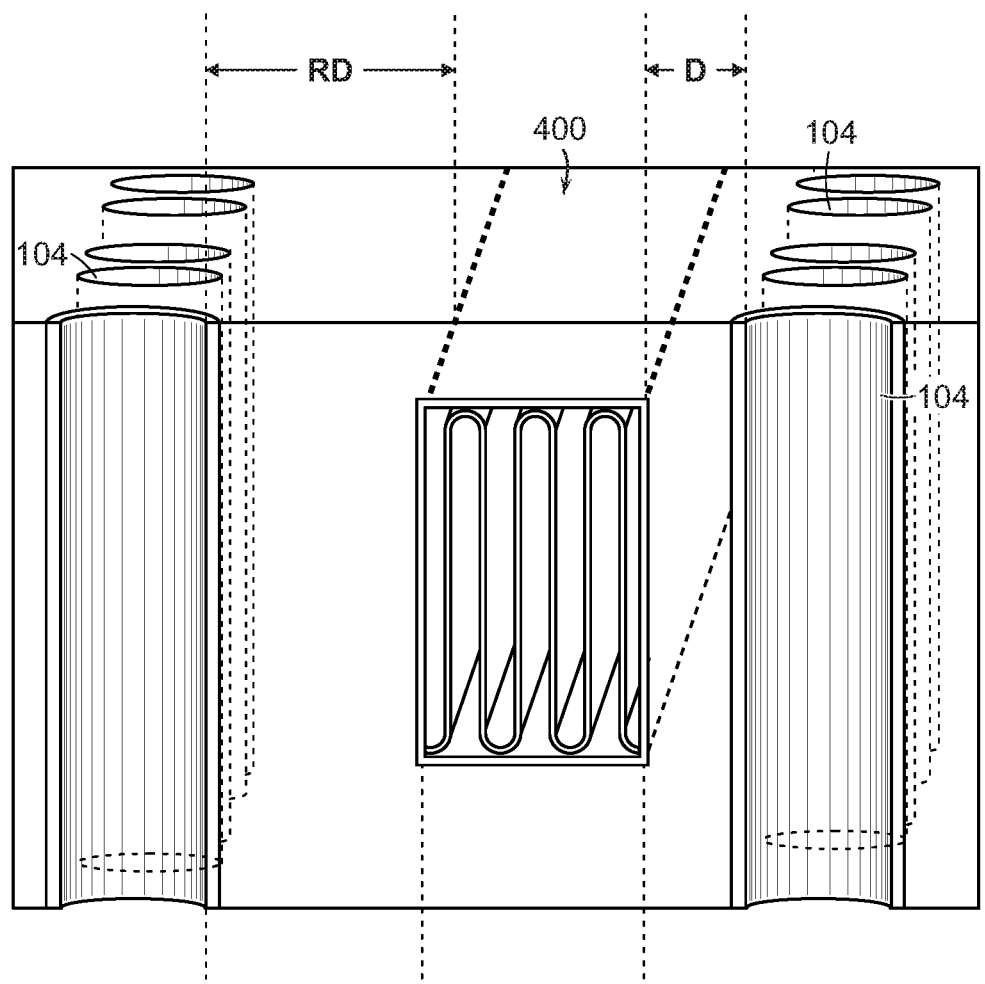
FIG. 13 is a cross-sectional view of a portion of the coldplate assembly of FIG. 8.

The conduit modules can be sealed by one of: vacuum brazing, an adhesive or welding. In the specific case of vacuum brazing, but also applicable to other sealing modes, because only the ends of the modules 400 need be sealed, the through-holes 104 can be moved closer once beyond the sealing distance S inward from each end. Accordingly, the space between the conduit structure and the interconnects can be reduced or used for other purposes, e.g., a distance D, as shown in FIG. 13, that is less than the distance PD discussed above. Advantageously, an amount of volume RD is gained for other uses.

Thus, aspects of the present disclosure advantageously provide for a modular coldplate construction that directly leads to reduced manufacturing inspection requirements. The risks of obstruction of finstock sections by braze alloy is no longer a concern.

The present disclosure is illustratively described above in reference to the disclosed implementations. Various modifications and changes may be made to the disclosed implementations by persons skilled in the art without departing from the scope of the present disclosure as defined in the appended claims.

What is claimed is:

1. A coldplate assembly, comprising:
   a base;
   a first conduit module of a first predetermined length having a first opening and a second opening;
   a first heat conducting structure provided within the first conduit module;
   a cover coupled to the base to capture the first conduit module between the base and the cover and to enclose and define a first manifold cavity between the base and the cover, wherein the cover and base include one or more interconnects linearly arranged between the cover and the base, wherein the first opening of the first conduit module is disposed in the first manifold cavity, and wherein the first opening of the first conduit module is sealed, about a portion of its periphery, a respective first sealing length, less than the first conduit module predetermined length, from the first opening toward the second opening.

2. The coldplate assembly of claim 1, wherein the sealed portion of the periphery of the first conduit module is within the first manifold cavity.

3. The coldplate assembly of claim 1, wherein the first conduit module is one of:
vacuum brazed about a portion of its periphery to the base and cover;
sealed about a portion of its periphery to the base and cover by an adhesive; or
welded about a portion of its periphery to the base and cover.

4. The coldplate assembly of claim 1, wherein the first heat conducting structure comprises one of: finstock, diffusion bonded cooling channels, or extruded tubes.

5. The coldplate assembly of claim 1, further comprising:
a first groove defined in the base,
wherein the first conduit module is provided in the first groove.

6. The coldplate assembly of claim 1, wherein the first conduit module comprises a leak-tight tube.

7. The coldplate assembly of claim 1, further comprising:
a second manifold cavity defined between the base and the cover,
wherein the second opening of the first conduit module is disposed in the second manifold cavity,
wherein the second opening of the first conduit module is sealed, about a portion of its periphery, a respective second sealing length, less than the first conduit module predetermined length, from the second opening toward the first opening, and
wherein the first and second manifold cavities are fluidly coupled by the first conduit module.

8. The coldplate assembly of claim 1, further comprising:
a second conduit module of a second predetermined length having a first opening and a second opening, provided between the base and the cover, the second conduit module first opening provided in the first manifold cavity; and
a second heat conducting structure provided within the second conduit module,
wherein the first opening of the second conduit module is sealed, about a portion of its periphery, a respective sealing length, less than the second conduit module predetermined length, from the first opening toward the second opening.

9. The coldplate assembly of claim 8, wherein the sealed portion of the periphery of the second conduit module is within the first manifold cavity.

10. The coldplate assembly of claim 8, wherein:
the first and second conduit modules have a same length, and
wherein the first and second respective sealing lengths are the same.

11. The coldplate assembly of claim 8, wherein the second conduit module is one of:
vacuum brazed about a portion of its periphery to the base and cover;
sealed about a portion of its periphery to the base and cover by an adhesive; or
welded about a portion of its periphery to the base and cover.

12. A coldplate assembly, comprising:
a base;
a cover;
a first conduit module of a first predetermined length comprising:
a first opening;
a second opening; and
a heat conducting structure provided within the first conduit module;
the cover coupled to the base to capture the first conduit module between the base and cover and to form first and second enclosed manifold cavities between the base and the cover, wherein the cover and base include one or more interconnects linearly arranged between the cover and the base,
wherein the first opening of the first conduit module is disposed within the first manifold cavity and the second opening of the first conduit module is disposed within the second manifold cavity,
wherein the first opening of the first conduit module is sealed, about a portion of its respective periphery within the first manifold cavity, a respective first sealing length, less than the first conduit module predetermined length, from the respective first opening toward the respective second opening,
wherein the respective second opening of the first conduit module is sealed, about a portion of its respective periphery within the second manifold cavity, a respective second sealing length, less than the first conduit module predetermined length, from the respective second opening toward the respective first opening, and
wherein the first and second manifold cavities are fluidly coupled to one another by the first conduit module.

13. The coldplate assembly of claim 12, wherein:
the first opening of the first conduit module is positioned within the enclosed first manifold cavity, and
wherein the second opening of the first conduit module is positioned within the enclosed second manifold cavity.

14. The coldplate assembly of claim 12, wherein the first conduit module is one of:
vacuum brazed about a portion of its respective periphery within the first or second manifold cavity to the base and cover;
sealed about a portion of its respective periphery within the first or second manifold cavity to the base and cover by an adhesive; or
welded about a portion of its respective periphery within the first or second manifold cavity to the base and cover.

15. The coldplate assembly of claim 12, wherein the first conduit module heat conducting structure comprises one of: finstock or diffusion bonded cooling channels.

16. The coldplate assembly of claim 12, further comprising:
a first groove defined in the base,
wherein the first conduit module is provided in the first groove.

17. The coldplate assembly of claim 12, wherein the first conduit module comprises a leak-tight tube.

18. The coldplate assembly of claim 12, further comprising:
- a second conduit module, of a second predetermined length, provided between the base and the cover, comprising:
  - a first opening;
  - a second opening; and
  - a heat conducting structure provided within the second conduit module,
- wherein the second conduit module first opening is provided in the first manifold cavity and the second conduit module second opening is provided in the second manifold cavity,
- wherein the first opening of the second conduit module is sealed, about its periphery within the first manifold cavity, a respective sealing length, less than the second conduit module predetermined length, from the respective first opening toward the respective second opening, and
- wherein the second opening of the second conduit module is sealed, about its periphery within the second manifold cavity, a respective sealing length, less than the second conduit module predetermined length, from the second opening toward the first opening.

19. The coldplate assembly of claim 18, wherein:
the first and second conduit modules have a same length, and
wherein the respective sealing lengths are the same.

20. The coldplate assembly of claim 18, wherein the second conduit module is one of:
- vacuum brazed about its respective periphery within the first or second manifold cavity to the base and cover;
- sealed about its respective periphery within the first or second manifold cavity to the base and cover by an adhesive; or
- welded about its respective periphery within the first or second manifold cavity to the base and cover.

* * * * *